United States Patent
Trimberger

(10) Patent No.: US 8,504,974 B1
(45) Date of Patent: Aug. 6, 2013

(54) ANALYSIS OF CIRCUIT DESIGNS

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 37 days.

(21) Appl. No.: 13/232,176

(22) Filed: Sep. 14, 2011

(51) Int. Cl.
*G06F 9/455* (2006.01)
*G06F 17/50* (2006.01)
*G06F 11/22* (2006.01)

(52) U.S. Cl.
USPC .......................................... 716/136; 716/133

(58) Field of Classification Search
USPC ................................................ 716/133, 136
See application file for complete search history.

(56) References Cited

U.S. PATENT DOCUMENTS

| | | | | |
|---|---|---|---|---|
| 5,966,523 | A * | 10/1999 | Uchino | 703/2 |
| 6,611,945 | B1 * | 8/2003 | Narasimhan et al. | 716/103 |
| 7,131,078 | B1 * | 10/2006 | Maheshwari et al. | 716/104 |
| 7,580,824 | B1 * | 8/2009 | Lewis et al. | 703/14 |
| 7,958,476 | B1 * | 6/2011 | Jiang et al. | 716/109 |
| 8,250,500 | B1 * | 8/2012 | Neto et al. | 716/101 |
| 8,370,778 | B1 * | 2/2013 | Rochel et al. | 716/106 |
| 2005/0240887 | A1 * | 10/2005 | Rajski et al. | 716/4 |
| 2006/0282803 | A1 * | 12/2006 | Wilcox et al. | 716/4 |
| 2010/0229132 | A1 * | 9/2010 | Gu et al. | 716/2 |
| 2012/0210291 | A1 * | 8/2012 | Gu et al. | 716/136 |

OTHER PUBLICATIONS

U.S. Appl. No. 12/398,270, filed Mar. 5, 2009, Schumacher et al.

Goldstein, Lawrence H., "Controllability/Observability Analysis of Digital Circuits" *IEEE Transactions on Circuits and Systems*, Sep. 1979, pp. 685-692, vol. CAS-26, No. 9, IEEE, Piscataway, New Jersey, USA.

Goldstein, Lawrence H., "SCOAP: Sandia Controllability/Observability Analysis Program" *17th Design Automation Conference*, Jun. 23, 1980, pp. 190-196, IEEE, Piscataway, New Jersey, USA.

Jain, Sunil K., "STAFAN: An Alternative to Fault Simulation," *Proc. of the 21st Design Automation Conference*, Jun. 25, 1984, pp. 18-23, IEEE, Piscataway, New Jersey, USA.

Rejimon, Thara, *Reliability-centric probabilistic analysis of VLSI*, Jun. 1, 2006, pp. 1-111, University of South Florida, Tampa, Florida, USA.

Univ. of British Columbia, Chapter 2, *Design for Testability, VLSI Test Principles and Architectures*, slides from Dr. André Ivanov's Integrated Circuit Design-for-Test Course EECE 578, Jan. 15, 2008, found at http://courses.ece.ubc.ca/578/, summarizing Chapter 2 of the book *VLSI Test Principles and Architectures*, by L.-T. Wang et al., Jul. 21, 2006, pp. 37-99, Morgan Kaufmann Publishers, Waltham, Massachusetts, USA.

* cited by examiner

Primary Examiner — Suresh Memula
(74) Attorney, Agent, or Firm — LeRoy D. Maunu

(57) ABSTRACT

In one embodiment, a method is provided for analyzing a circuit design. For each sub-circuit of a plurality of sub-circuits specified in the circuit design, a logic level probability is determined for each output of the sub-circuit. The logic level probability indicates the probability that an output of the sub-circuit will have a first value in response to possible values of inputs to the sub-circuit. Each logic level probability is converted to a switching probability that indicates a probability that a switching event will occur at the respective output of the sub-circuit within a time period. The switching probability is stored in a memory.

18 Claims, 4 Drawing Sheets

ANALYSIS OF CIRCUIT DESIGNS

FIELD OF THE INVENTION

One or more embodiments generally relate to the analysis of circuit designs.

BACKGROUND

Due to advancements in processing technology, complex integrated circuits (ICs) can be designed at various levels of abstraction. Using a hardware description language (HDL), circuits can be designed at the gate level, the register transfer level (RTL), and/or higher logical levels. When designing using an HDL, the design is often structured in a modular manner. The designer describes a module in terms of the generation and propagation of signals from one set of registers through combinatorial modules to another set of registers. HDLs provide a rich set of constructs to describe the functionality of a module. Modules may be combined and augmented to form even higher level modules.

To reduce design costs, designers often incorporate previously created designs that have been provided either from within an enterprise or from a commercial provider. Libraries of pre-developed blocks of logic have been developed that can be selected and included in a circuit design. Such library modules include, for example, adders, multipliers, filters, and other arithmetic and digital signal processing (DSP) functions from which system designs can be readily constructed. These previously created designs are sometimes referred to as "IP cores" (intellectual property cores), or "logic cores," and such terms may be used interchangeably herein. The use of pre-developed logic cores permits faster design cycles by eliminating the redesign of circuits. Thus, using cores from a library may reduce design costs.

Prior to implementation, an HDL design can be simulated to determine whether the design will produce correct output. By detecting errors early in the development cycle, wasted manufacturing costs due to faulty design may be avoided. In addition, it may be desirable to analyze performance attributes such as speed, power consumption, etc. One such attribute is susceptibility to single event upsets (SEU). SEUs occur as a result of fast-moving subatomic particles that interact with silicon atoms. When a single ion or neutron strikes a silicon substrate, it loses energy through the creation of free electron hole pairs. This results in a dense ionized track in the local region and a current pulse that can upset the circuit. The current pulse may or may not affect the circuit, depending on the switching behavior of the logic circuits in the circuit design. Thus, different portions of a circuit design may be more susceptible than others. If high-risk portions of a circuit design can be identified early in the design cycle, a designer may be able to mitigate the susceptibility through various design choices.

Precise measurement of switching activity requires test vectors, i.e., sample data that is used by the circuit design. Test vectors can be difficult to develop and may not fully exercise the circuit design. Further, an estimate of switching activity may be required early in the design process in order to be able to select from among alternative designs for a low-power design or high-reliability design. However, early in the design process, the circuit design may not be sufficiently complete to run test vectors, so a method of estimating switching activity without required test vectors is desirable.

One or more embodiments of the disclosure invention may address one or more of the above issues.

SUMMARY

In one embodiment, a method is provided for analyzing a circuit design. For each sub-circuit of a plurality of sub-circuits specified in the circuit design, a logic level probability is determined for each output of the sub-circuit. The logic level probability indicates the probability that an output of the sub-circuit will have a first value in response to possible values of inputs to the sub-circuit. Each logic level probability is converted to a switching probability that indicates a probability that a switching event will occur at the respective output of the sub-circuit within a time period. The switching probability is stored in a memory.

In another embodiment, a system is provided for circuit design analysis. The system includes one or more processors and a memory coupled to the one or more processors. The one or more processors and memory are configured and arranged to determine a respective logic level probability for each output of each of a plurality of sub-circuits. The logic level probability indicates the probability that an output of the sub-circuit will have a first value in response to possible values of inputs to the sub-circuit. The processors and memory are configured to convert each logic level probability to a switching probability. The switching probability indicates a probability that a switching event will occur at the respective output of the sub-circuit within a time period. The processors are configured to store the switching probability.

In yet another embodiment, a method of analyzing a circuit design is provided. A first probability, indicating a likelihood that an output of the sub-circuit will have a first value in response to possible values of inputs to the sub-circuit, is converted to a second probability that a switching event will occur at the output of the sub-circuit in the circuit design within a time period. In one embodiment, the conversion is performed by determining a third probability of two sequential values of the output of the sub-circuit being the first value and determining the fourth probability of two sequential values of the output of the sub-circuit being a second value. The third probability and the fourth probability are subtracted from a value of 1 to produce the second probability that a switching event will occur at the output of the sub-circuit in the time period.

It will be appreciated that various other embodiments are set forth in the Detailed Description and Claims which follow.

BRIEF DESCRIPTION OF THE DRAWINGS

Various aspects and advantages will become apparent upon review of the following detailed description and upon reference to the drawings in which:

FIGS. 2-1 through 2-5 illustrate determination of logic level probabilities of nodes a circuit design using an example implementation of the process shown in FIG. 1; and FIG. 3 shows a block diagram of an example computing arrangement, which may be configured to implement the processes described herein in accordance with one or more embodiments.

DETAILED DESCRIPTION

Figure 1:
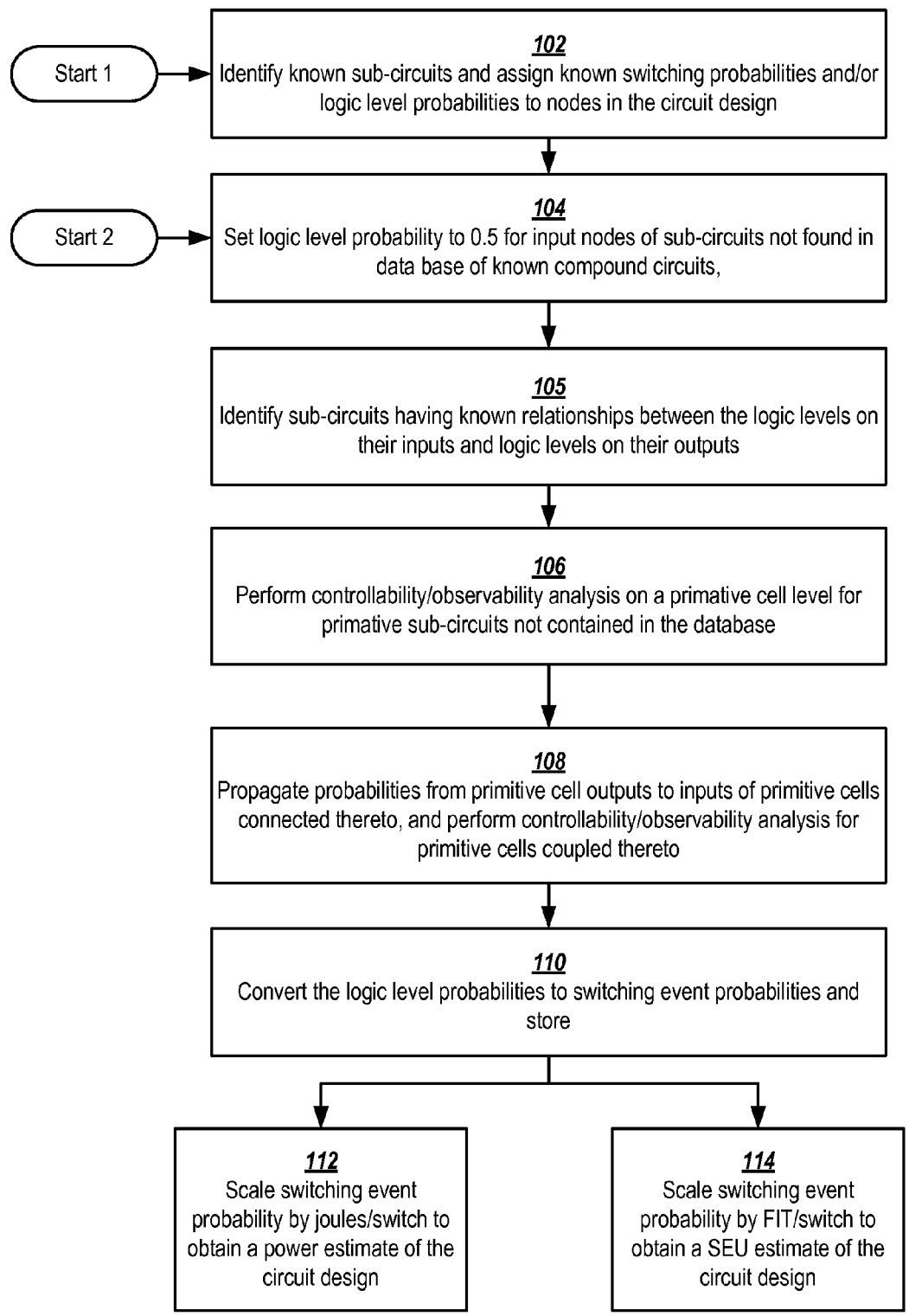
FIG. 1 shows a flow chart of an example process for circuit design analysis in accordance with one or more embodiments.

In integrated circuits, the switching activity of the circuit may affect a number of aspects of circuit performance including, for example, the average power dissipation of the circuit, SEU susceptibility, etc. One or more embodiments provide a method for analysis of a circuit design. The switching activity of one or more nodes of a circuit design is determined from a probability that the node will be a certain value.

In one or more embodiments, one or more sub-circuits of a circuit design are analyzed to determine a first probability that an output node of the sub-circuit will have a first value (e.g., logic 1) in response to possible input values. The sub-circuits may include primitive logic gates or compound circuits. Each of the first probabilities is then converted to a second probability that a switching event will occur at the output node of the respective sub-circuit.

As used herein, sub-circuit is used to generically refer to a component of the circuit design. A sub-circuit may be a primitive logic gate or a compound circuit that contains two or more primitive logic gates. Examples of primitive logic gates include NOT gates, OR gates, AND gates, NOR gates, NAND gates, XOR gates, etc. and all Morgan equivalents. The probability that a node will have a particular value may be referred to as a logic level probability as used herein. The probability that a switching event (i.e., switch from a logic 0 to a logic 1 or from a logic 1 to a logic 0) will occur at a node within a particular time period, for example a clock cycle, may be referred to as a switching probability.

In one or more embodiments, the probability that an output node of each sub-circuit will have a particular logic level or switching probability value is determined as follows. Sub-circuits having output nodes with known logic level or switching probabilities are identified from a database, corresponding logic level or switching probabilities are retrieved, and respective output nodes of the subcircuits are assigned the retrieved probabilities. For remaining sub-circuits for which logic level and/or switching probabilities of output nodes are not known, the remaining sub-circuits are analyzed to determine respective logic level probabilities for the output nodes. For nodes having assigned logic level probabilities, the logic level probabilities are then converted to respective switching probabilities, as described below.

To determine the logic level probabilities of output nodes of the remaining sub-circuits, the logic level probabilities of the inputs of those remaining sub-circuits are set to the known logic level probabilities of the output nodes to which the input nodes are connected, respectively. The logic level probabilities of input nodes that are connected to sub-circuits with unknown logic level probabilities, are set to 1/n, where n is the number of possible input values. For example, for binary logic circuits (n=2) the logic level probabilities of the inputs are set to 0.5. The logic level probability of each non-input node in the circuit design is then determined by performing controllability/observability analysis, which is discussed below. Clock nodes may be treated specially, and may be used to scale the computed switching frequencies. Nodes that switch based on outputs of flip-flops switch at a rate proportional to the clock frequency of the clock of the flip flops.

FIG. 1 shows a flow chart of an example process for circuit design analysis in accordance with one or more embodiments. In some implementations, the circuit may be initially analyzed at block 102 to identify known compound sub-circuits of the circuit design and assign known switching probabilities and/or logic level probabilities to nodes coupled to outputs of the known compound sub-circuits. For ease of reference, sub-circuits of the circuit design that are identified at block 102 may be referred to as known sub-circuits, and the output nodes that are annotated with a known logic level or switching probability may be referred to as known nodes. Nodes that are not annotated with a known logic level or switching frequency may be referred to as unknown nodes.

The identification of known sub-circuits at block 102 may be useful if the circuit design includes complex pre-designed and pre-characterized circuits, where the developer of the circuit design does not have access to the internal logic. In addition, a user may also supplement the database or manually specify a switching probability value for some nodes in the circuit design. It is recognized that some embodiments may skip the analysis performed at block 102 and begin the analysis process at block 104.

Unknown input nodes, and optionally flip-flop outputs, are assigned a logic level probability of 0.5 at block 104 (i.e., the probability that the input will have an equal chance of being either logic 0 or logic 1).

In block 105, sub-circuits that have known relationships between the logic levels on their inputs and logic levels on their outputs are identified from a database. The sub-circuits identified at block 105 may include primitive logic gates or compound sub-circuits. For example, the database may include lookup-tables (LUTs) with known contents, such as those commonly used in FPGAs, as well as more complex sub-circuits such as counters and multiplexers. For simplicity of discussion, all sub-circuits with known relationships between the logic levels on their inputs and logic levels on their outputs may be referred to as primitive cells, even if they are larger than primitive logic gates. The analysis of unknown nodes performed at blocks 104 through 106 is conducted at the level of a primitive cell. Compound sub-circuits, such as those containing two or more primitive logic gates, are decomposed into primitive logic gates (not shown).

Observability/controllability analysis of the sub-circuits is performed to determine respective logic-level probabilities at block 106. Using the relationships between logic level probabilities on inputs and outputs of primitive cells, the logic level probability of the output of each primitive cell identified at block 105 is determined.

The logic level probabilities are propagated from the corresponding outputs of primitive cells to inputs of other primitive cells according to the nodes connecting them, and observability/controllability analysis is performed on the primitive cells that receive the new values at block 108. In some embodiments, if the updated logic level probability on an input to a primitive cell is not sufficiently different from the existing value (for example, a five percent difference), the primitive cell is not analyzed to have new logic level probabilities generated for its outputs. Now that additional logic level probabilities are known, the propagation and analysis are repeated at block 108 until logic level probabilities have been computed for all nodes in the circuit design. In some embodiments, each flip-flop may be treated as a primitive cell, with the output logic level probability the same as the input probability. Nodes in different clock domains may have their probabilities scaled by the clock frequency. Observability/controllability analysis is discussed in more detail with reference to FIG. 2 below.

In some embodiments, logic level probabilities of nodes previously identified at block 102 or 105 may be recalculated, in response to the propagation performed at block 108. In other embodiments, the logic level probabilities of the nodes of known sub-circuits are not affected by propagation and recalculation of logic level probabilities.

After calculating logic level probabilities at blocks 102-108, at block 110 each logic level probability is converted to a respective switching probability and stored in a memory for subsequent use. As indicated above, the switching probability indicates the probability that the output node will exhibit a switching event in a given clock cycle (i.e., switch from a logic 0 to a logic 1 or from a logic 1 to a logic 0). In general, a larger difference between the probability that an output node will be a logic 0 ($P_0$) and the probability that the output will be a logic 1 ($P_1$), indicates that the output node is not as likely to switch values. Conversely, if there is a small difference between $P_0$ and $P_1$ (e.g., both $P_0$ and $P_1$ are approximately equal to 0.5) the output node is more likely to switch values since there is a more balanced probability of the output having either of the two values. The probability that a node will not switch ($\sim P_{SW}$) is given by $$\sim P_{SW} = (P_0 * P_0) + (P_1 * P_1)$$

The term ($P_0*P_0$) indicates the probability that the node will have the a value of logical zero at two different times, and ($P_1*P_1$) indicates the probability that the output will have a value of logical 1 at two different times. In particular, if the two times are chosen to be successive clock cycles, the products give the probabilities of the node not changing value from one clock cycle to the next, and the sum of the two is the probability that the node does not change, whether it started as zero or one. The switching probability is then equal to, $$P_{SW} = 1 - \sim P_{SW} = 1 - \{(P_0*P_0) + (P_1*P_1)\}$$

It is important to note that this switching probability can be computed without knowing the data upon which the circuit may be run, if desired, so no test vectors are required to estimate switching frequency using this method.

In a two-valued (binary) system, $P_0$ may be calculated directly from $P_1$ as shown by, $$P_0 = 1 - P_1$$

Other calculations may be used. For example, a different equation may be used to give greater or lesser switching probability to nodes having more dissimilar logic level probabilities, for example by increasing $P_{SW}$ if $|P_0 - P_1| > 0.5$. Further, some computations may include a third probability, a probability that the logic level is unknown. In this case, the computation of the switching probability may assume half the $P_{UNKNOWN}$ probability may be treated as $P_0$ and half as $P_1$. Other computations may also be used. Other evaluations may use multi-valued logic (four or more separate logic values on a node), wherein the probability of switching is different for different logic levels and the power consumed by each switch is different.

The switching probability may be used to determine a number of useful attributes of the circuit design. For example, CMOS based circuits consume energy when transitioning between logic 0 and logic 1 values but do not consume significant power while holding steady values of either logic 0 or logic 1. Power consumption of each node can therefore be estimated from the frequency of switching events over a period of time. The power consumption of the circuit design can be estimated from the sum of all the power consumed by all switching nodes. Optionally, power consumption estimates can be improved by weighting each node's switching probability by the loading on the node. As shown in block 112, the switching probability of each node can be scaled by a respective factor that indicates an average number of joules consumed by the sub-circuit for a switching event. The factor may be the clock rate associated with the sub-circuit, the load on the node, or functions thereof, for example. Other computations may be used to estimate power consumption from switching probability.

The switching probability may also be used to provide an indication of the likelihood a function of a circuit design will be affected by an SEU. To provide such indication, the switching probability is multiplied by a user-defined constant indicating a number of failures in time (FIT) that occur for each switching event of the sub-circuit at block 114. Other computations may be used to estimate SEU sensitivity from switching probability.

Figures 1, 2:
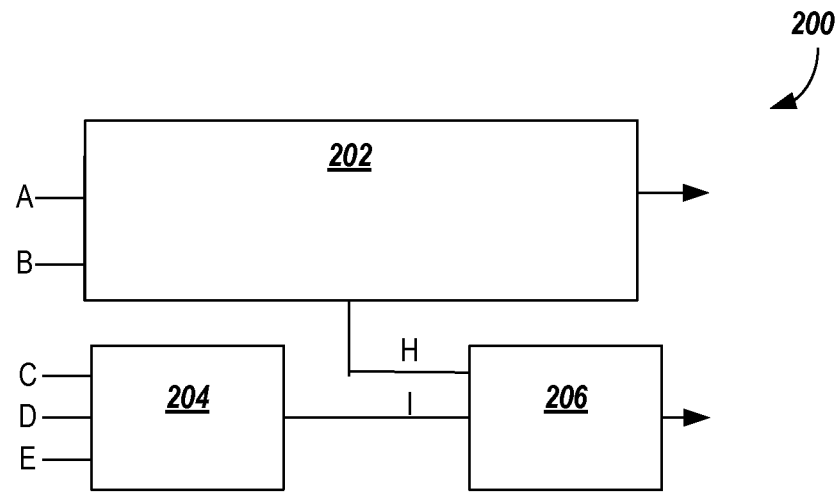
Figure 2:
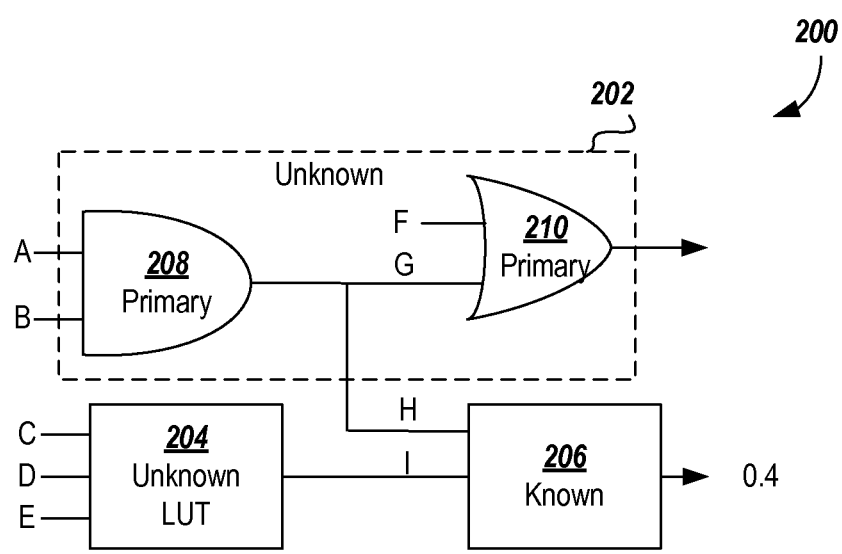

FIGS. 2-1 through 2-5 illustrate determination of logic level probabilities of nodes of a circuit design according to the process shown in FIG. 1. FIGS. 2-1 shows a circuit design 200 having sub-circuits 202, 204, and 206 with respective inputs A and B; C, D, and E; and H and I. For this example, the switching probability of each node is unknown. As described with reference to block 102 of FIG. 1, FIGS. 2-2 illustrates identification of sub-circuit 206 and retrieval of a corresponding logic level probability of the output node of sub-circuit 206 from a database of known compound circuits. For purposes of discussion, the output node of sub-circuit 206 is assumed to have logic level probability equal to 0.4 for a set of unknown input values. Sub-circuit 202 is an unknown compound circuit including primary components. In this example, unknown sub-circuits are analyzed at the primitive gate level. Accordingly, sub-circuit 202 is decomposed into primitive gates 208 and 210 as shown in FIG. 2-2.

Figures 2, 3:
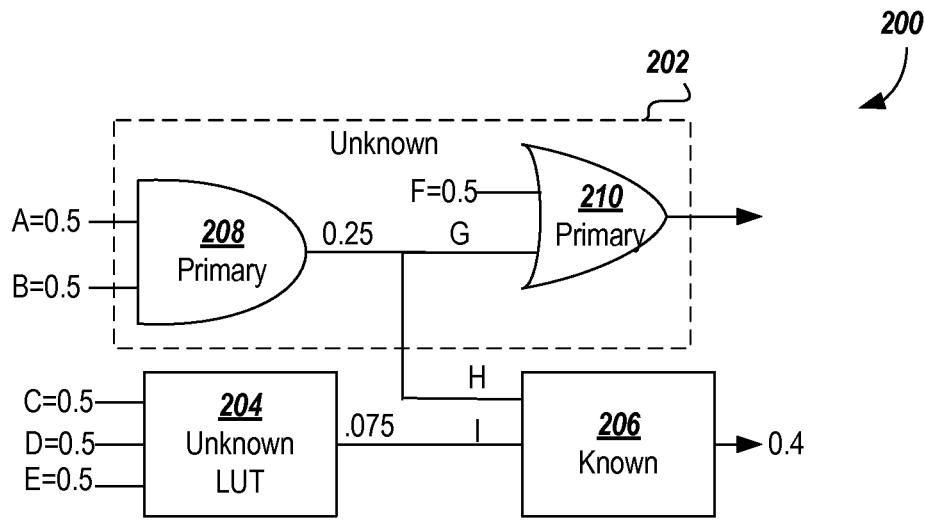

FIGS. 2-3 illustrates setting of logic level probabilities of inputs of the circuit design as described with reference to block 104 of FIG. 1. The example uses binary logic and shows $P_1$, the probability the node is logic "1". In this example, inputs nodes A, B, C, D, E, and F of the circuit design 200, which correspond to inputs of unknown sub-circuits, are set to have logic level probabilities of 0.5.

FIGS. 2-3 also illustrates performing controllability analysis of primitive gate 208 and LUT 204 as described with reference to block 106 of FIG. 1. Controllability indicates the ability of input values of a circuit to affect an output of the circuit and may be used to define a relationship between logic level probabilities of input and output nodes of a sub-circuit. The controllability analysis determines a logic level probability of an output node based on the logic level probabilities of the inputs being a first value (e.g., logic 1). In one or more embodiments, the controllability analysis identifies the primitive gate 208 from a database of primitive gates and retrieves a corresponding controllability equation from the database. In this case, the primitive gate 208 is an AND gate which has a output value probability of being logic 1, $P_{AND}$, given by, e.g., $$P_{AND} = P_{A1} * P_{B1} = 0.5 * 0.5 = 0.25.$$

In some embodiments, a logic level probability of the output node may be determined from a generic equation corresponding to the type of circuit. For example, a logic level probability of the output node of an N-input LUT 204 ($P_{LUT1}$) is given by, $$P_{LUT1} = 5\Sigma_{i=1}^{2N}(\text{if } LUT[i] == 1, \text{then } P(\text{INPUTS}=i), \text{else } 0)$$

where LUT[i] is the $i^{th}$ LUT table entry and P(INPUTS=i) is the probability that the inputs to the LUT will select that $i^{th}$ LUT table entry. If all inputs have equal probability of being 1 or 0, this equation can be written as follows:

$$P_{LUT1} = 0.5^N * \Sigma_{i=1}^{2N}(\text{if } LUT[i] == 1, \text{then } 1, \text{else } 0)$$

wherein ($0.5^N$) represents the product of the input value probabilities (i.e., the probability of a particular combination of input values of N inputs). The summation determines the number of combinations of inputs to the LUT, which produce an output from the LUT value of logic 1. The product of these values is the overall probability of the output having a value of 1. For purposes of this example, the logic level probability of the output of LUT 204 is assumed to be equal to 0.75, indicating that 6 of the 8 used LUT table entries are logic 1 (6/8=0.75).

Figures 2, 3, 4:
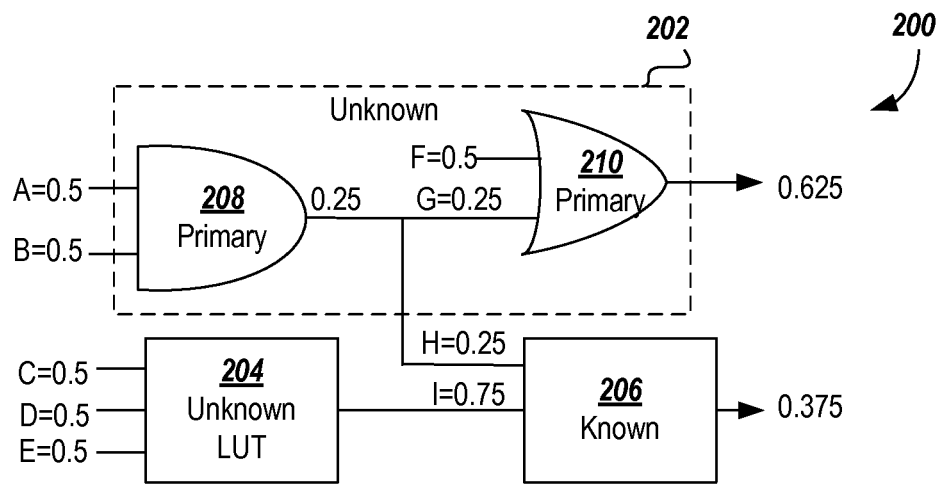
Figures 2, 3, 4, 5:
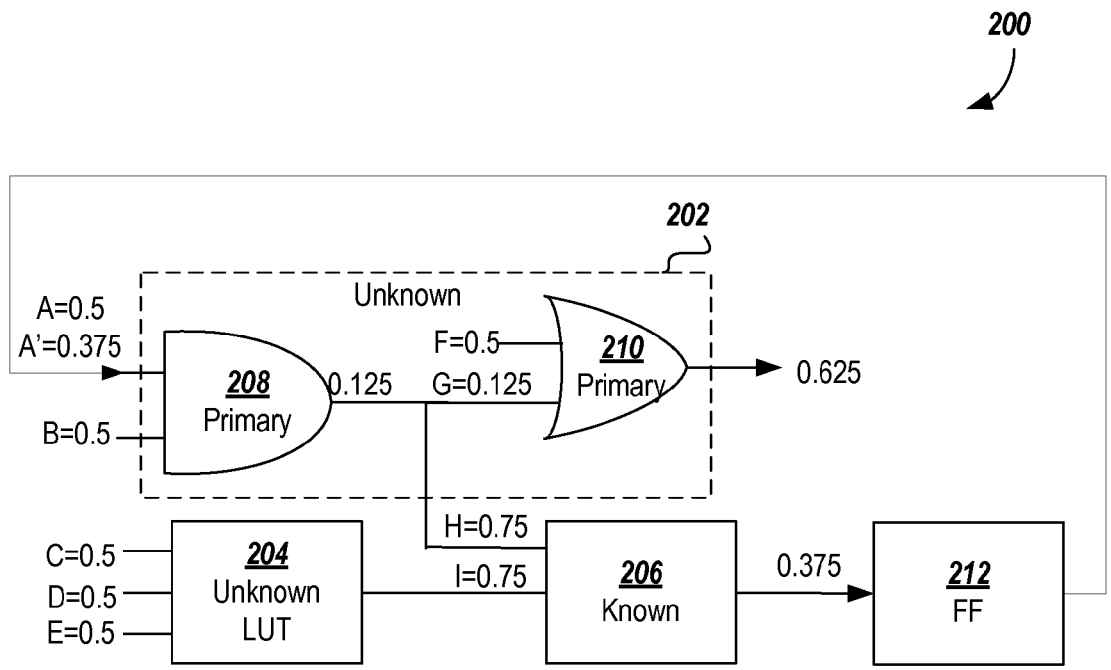
Figure 3:
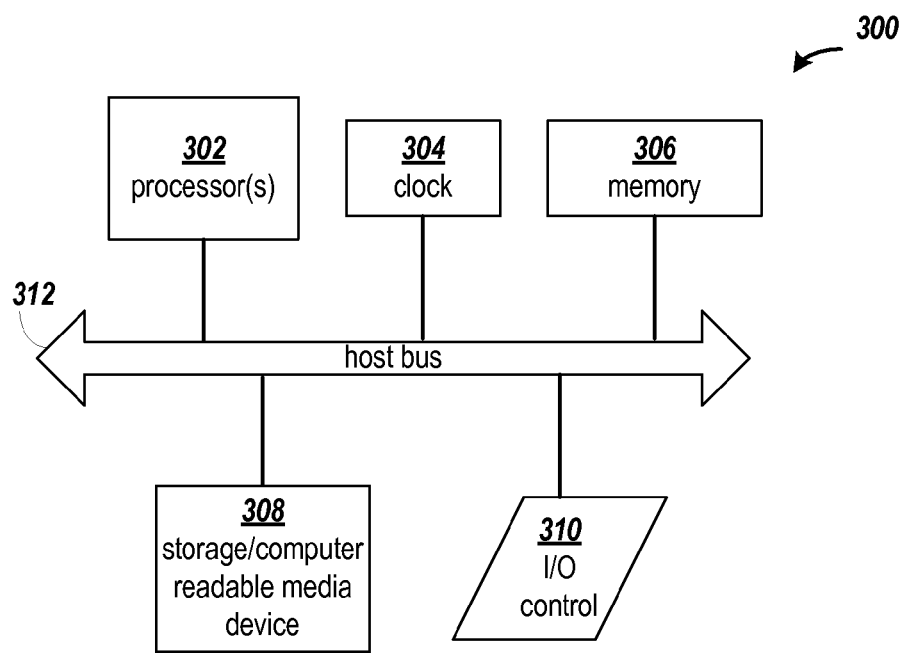

FIGS. 2-4 illustrates propagation of the determined output value probabilities of primitive gate 208 and LUT 204 and analysis of gate 210 in accordance to the process described with reference to block 108 of FIG. 1 above. Similar to the controllability analysis of primitive gate 208 depicted in FIGS. 2-3, a controllability equation for primitive OR gate 210 may be retrieved from a database of primitive gate values. In this example, the logic level probability of the node $P_{OR}$ is given by, e.g., $$P_{OR}=1-(P_{G0}*P_{F0})=1-(0.5*0.75)=0.625.$$

As illustrated in this example, in some embodiments the logic level probability of an output node of a known sub-circuit, such as 206, may be recalculated if a logic level probability of an input of the sub-circuit is changed during analysis due to propagation. For purposes of discussion, the output node of sub-circuit 206 is assumed to have logic level probability equation for logic 1 output probability, $$P_{206}=(P_{H0}*P_{I0})+(P_{H1}*P_{I1})$$

which corresponds to a NXOR logic gate. It is understood that the equation for $P_{206}$ is provided for discussion purposes only. Applying the logic level probabilities of inputs to the equation gives $$P_{206}=(0.75*0.25)+(0.25*0.75)=0.0625+0.5625=0.375.$$

In some other embodiments, the logic level probability of output nodes of one or more known sub-circuits, such as sub-circuit 206, may not be affected by the propagation changing the logic level probability of a node connected to an output of the sub-circuit.

Different embodiments may perform propagation of logic level probabilities differently for when the circuit contains a flip flop or other register. For example, FIGS. 2-5 shows the circuit of 2-4 with a flip flop 212 coupled to the output of sub-circuit 206. The output of the flip flop 212 is coupled to input node A of gate 208. In some embodiments, logic level probabilities are not propagated through flip flops. In such embodiments, node A would retain the previously set logic level probability A=0.5. In some other embodiments, the output of the flip-flop is assigned the same logic-level probability as its input. In such an implementation, propagation through flip flop 212 would change the logic-level probability of node A to a value A'=0.375. In some embodiments, this change to the input may trigger a re-calculation of the logic-level probability of the output node of sub-circuit 208. In this case, the new logic-level probability of sub-circuit 208 will be 0.5*0.375=0.1875, possibly prompting further recalculation of logic-level probabilities.

It is recognized that determination of logic level probabilities of output nodes of primitive logic gates is not limited to the controllability analysis described above. For example, in some embodiments output value probabilities may be determined using observability analysis, which determines the difficulty of observing the state of inputs of the primitive logic gate. A more thorough discussion of some example primitive gate analysis techniques may be found in Lawrence Goldstein and Evelyn Thigpen, "SCOAP: SANDIA CONTROLLABILITY/OBSERVABILITY ANALYSIS PROGRAM, Design Automation Conference—DAC, pp. 397-403, (1988).

FIG. 3 is a block diagram of an example computing arrangement on which the processes described herein may be implemented using a general purpose processor. Those skilled in the art will appreciate that various alternative computing arrangements, including one or more processors and a memory arrangement configured with program code, would be suitable for hosting the processes and data structures and implementing the algorithms of the different embodiments. The computer code that implements the processes of the disclosed embodiments are encoded in a processor executable format and may be stored and provided via a variety of computer-readable storage media or delivery channels such as magnetic or optical disks or tapes, electronic storage devices, or as application services over a network.

Processor computing arrangement 300 includes one or more processors 302, a clock signal generator 304, a memory unit 306, a storage unit 308, and an input/output control unit 310 coupled to host bus 312. The arrangement 300 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 302 may be one or more general purpose processors, or a combination of one or more general purpose processors and suitable co-processors, or one or more specialized processors (e.g., RISC, CISC, pipelined, etc.).

The memory arrangement 306 typically includes multiple levels of cache memory and a main memory. The storage arrangement 308 may include local and/or remote persistent storage such as provided by magnetic disks (not shown), flash, EPROM, or other non-volatile data storage. The storage unit may be read or read/write capable. Further, the memory 306 and storage 308 may be combined in a single arrangement.

The processor arrangement 302 executes the software in storage 308 and/or memory 306 arrangements, reads data from and stores data to the storage 308 and/or memory 306 arrangements, and communicates with external devices through the input/output control arrangement 310. These functions are synchronized by the clock signal generator 304. The resource of the computing arrangement may be managed by either an operating system (not shown), or a hardware control unit (not shown).

The present invention is thought to be applicable to a variety of systems for analysis of circuit designs. Other aspects and embodiments of the present invention will be apparent to those skilled in the art from consideration of the specification and practice of the invention disclosed herein, including designs with more than two logic levels. It is intended that the specification and illustrated embodiments be considered as examples only, with a true scope and spirit of the invention being indicated by the following claims.

What is claimed is:

1. A method of analyzing a circuit design, comprising performing operations on a programmed processor, the operations including for each sub-circuit of a plurality of sub-circuits specified in the circuit design:
   determining a respective logic level probability that indicates a probability that an output of the sub-circuit will have a first value in response to possible values of inputs to the sub-circuit;
   wherein the determining of the respective logic level probability includes:

retrieving the logic level probability from a database describing a plurality of compound circuits and associated logic level probabilities for respective outputs of the compound circuits;

for each input of the circuit design coupled to an input of one of the plurality of sub-circuits that is not described in the database of compound circuits, setting a logic level probability of the input to 0.5, wherein the logic level probability indicates a probability that the input will have the first value; and determining the logic level probability of each output of a sub-circuit as a function of logic level probabilities of inputs of the sub-circuit;

converting, by the programmed processor, each logic level probability to a switching probability that indicates a probability that a switching event will occur at the respective output of the sub-circuit within a time period; and storing the switching probability.

2. The method of claim 1, wherein the time period comprises a clock cycle.

3. The method of claim 1, further comprising:
determining, for each sub-circuit of the plurality of sub-circuits that is not described in the database of compound circuits, a respective logic level probability of each output of the sub-circuit in response to setting a logic level probability of one or more inputs of the sub-circuit; and in response to determining the logic level probability of an output of the sub-circuit, setting a respective logic level probability of one or more sub-circuit inputs coupled to the respective output to include the logic level probability of the output of the sub-circuit.

4. The method of claim 3, wherein:
one of more of the plurality of sub-circuits is a flip-flop; and
for each flip-flop, the determining of the respective logic level probability of the output of the flip-flop includes setting the logic level probability of the flip-flop equal to a logic level probability of an input of the flip-flop.

5. The method of claim 3, wherein the determining the respective logic level probability for each output of the plurality of sub-circuits not described in the database includes:
performing controllability/observability analysis using logic level probabilities of inputs of the sub-circuit that have been set in response to determining a logic level probability of another one of the outputs of the plurality of sub-circuits.

6. The method of claim 5, wherein performing controllability/observability analysis includes:
determining an equation that describes output of the sub-circuit as a function of inputs to the sub-circuit; and
determining the logic level probability of the output of the sub-circuit based on the equation and the respective logic level probabilities of the inputs to the sub-circuit.

7. The method of claim 6, wherein:
each of the sub-circuits of the plurality of sub-circuits that is not described in the database is a primitive logic gate; and
for each of the sub-circuits not described in the database, the determining of the equation that describes the output of the sub-circuit as a function of inputs to the sub-circuit includes retrieving a controllability equation corresponding to the sub-circuit from a database describing a plurality of primitive logic gates and associated controllability equations.

8. The method of claim 1, further comprising, scaling each determined switching probability by a respective factor associated with the respective output of the sub-circuit to determine a respective power consumption value, wherein the respective factor specifies joules consumed per switching event.

9. The method of claim 1, further comprising, scaling each switching probability by a respective constant of the sub-circuit that specifies a number of failures in time (FIT) per switching event to determine a respective value indicative of susceptibility to single event upsets.

10. The method of claim 1, wherein:
the determining of the logic level probability of each output of a sub-circuit as a function of logic level probabilities of inputs of the sub-circuit includes:
determining a third probability of two sequential values of the output of the sub-circuit being the first value; and
determining a fourth probability of two sequential values of the output of the sub-circuit being a second value; and
the converting includes subtracting the third probability and the fourth probability from a value of 1 to produce the second probability that a switching event will occur at the output of the sub-circuit in the time period.

11. The method of claim 10, further comprising:
for each sub-circuit of the one or more sub-circuits of the circuit design, scaling the probability of a switching event by a respective constant specifying joules consumed per switching event to determine a respective power consumption value.

12. The method of claim 10, further comprising:
for each sub-circuit of the one or more sub-circuits of the circuit design, multiplying the probability of a switching event by a respective constant specifying a number of failures in time (FIT) per switching event to determine a respective SEU susceptibility value.

13. A system for circuit design analysis, comprising:
one or more processors and a memory coupled to the one or more processors, the one or more processors and memory configured and arranged to perform operations including, for each sub-circuit of a plurality of sub-circuits specified in the circuit design:
determining a respective logic level probability that indicates a probability that the respective output of the sub-circuit will have a first value in response to possible values of inputs to the sub-circuit;
wherein the determining of the respective logic level probability includes:
retrieving the logic level probability from a database describing a plurality of compound circuits and associated logic level probabilities for respective outputs of the compound circuits;
for each input of the circuit design coupled to an input of one of the plurality of sub-circuits that is not described in the database of compound circuits, setting a logic level probability of the input to 0.5, indicating a 50% probability that the input will have the first value; and
determining the logic level probability of each output of a sub-circuit as a function of logic level probabilities of inputs of the sub-circuit;
converting each logic level probability to a switching probability that indicates a probability that a switching event will occur at the respective output of the sub-circuit within a time period; and
storing the switching probability.

14. The system of claim 13, wherein the time period is a clock cycle.

15. The system of claim 13, wherein the processors and memory are further configured and arranged to:
- determine, for each sub-circuit of the plurality of sub-circuits that is not described in the database of compound circuits, a respective logic level probability of each output of the sub-circuit in response to setting a logic level probability of one or more inputs of the sub-circuit; and
- in response to determining the logic level probability of an output of the sub-circuit, set a respective logic level probability of one or more sub-circuit inputs coupled to the respective output to include the logic level probability of the output of the sub-circuit.

16. The system of claim 15, wherein:
one of more of the plurality of sub-circuits is a flip-flop; and
the processors and memory are further configured and arranged to determine a respective logic level probability of the output of each flip-flop by setting the logic level probability of the flip-flop equal to a logic level probability of an input of the flip-flop.

17. The system of claim 13, wherein the processors and memory are further configured and arranged to scale each determined switching probability by a respective factor associated with the respective output of the sub-circuit to determine a respective power consumption value, wherein the respective factor specifies joules consumed per switching event.

18. The system of claim 13, wherein the processors and memory are further configured and arranged to scale each switching probability by a respective constant of the sub-circuit that specifies a number of failures in time (FIT) per switching event to determine a respective value indicative of susceptibility to single event upsets.

* * * * *